(12) United States Patent
Rana et al.

(10) Patent No.: US 7,846,762 B2
(45) Date of Patent: Dec. 7, 2010

(54) INTEGRATED EMITTER FORMATION AND PASSIVATION

(75) Inventors: Virendra V. Rana, Burlingame, CA (US); Robert Z. Bachrach, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/234,848

(22) Filed: Sep. 22, 2008

(65) Prior Publication Data

US 2010/0075485 A1    Mar. 25, 2010

(51) Int. Cl.
  *H01L 21/00* (2006.01)
(52) U.S. Cl. .................. 438/73; 438/482; 257/E21.135
(58) Field of Classification Search .................... 438/73, 438/482; 257/E21.135
  See application file for complete search history.

(56) References Cited

U.S. PATENT DOCUMENTS

2008/0057220 A1*    3/2008    Bachrach et al. ............ 427/569

* cited by examiner

*Primary Examiner*—Jack Chen
(74) *Attorney, Agent, or Firm*—Patterson & Sheridan, LLP

(57) ABSTRACT

Embodiments of the present invention provide a method for forming an emitter region in a crystalline silicon substrate and passivating the surface thereof by depositing a doped amorphous silicon layer onto the crystalline silicon substrate and thermally annealing the crystalline silicon substrate while oxidizing the surface thereof. In one embodiment, the deposited film is completely converted to oxide. In another embodiment, the doped amorphous silicon layer deposited onto the crystalline silicon substrate is converted into crystalline silicon having the same grain structure and crystal orientation as the underlying crystalline silicon substrate upon which the amorphous silicon was initially deposited during emitter formation. In one embodiment, at least a portion of the converted crystalline silicon is further converted into silicon dioxide during the emitter surface passivation.

13 Claims, 3 Drawing Sheets

US 7,846,762 B2

INTEGRATED EMITTER FORMATION AND PASSIVATION

BACKGROUND OF THE INVENTION

1. Field of the Invention

Embodiments of the present invention generally relate to the fabrication of crystalline silicon solar cells and, more particularly, to a method of integrated formation and passivation an emitter portion of a solar cell.

2. Description of the Related Art

Solar cells are photovoltaic (PV) devices that convert sunlight directly into electrical power. Solar cells typically have one or more p-n junctions. Each junction comprises two different regions within a semiconductor material where one side is denoted as the p-type region and the other as the n-type, or emitter, region. When the p-n junction of a solar cell is exposed to sunlight (consisting of energy from photons), the sunlight is directly converted to electricity through the PV effect. Solar cells generate a specific amount of electric power and are tiled into modules sized to deliver the desired amount of system power. Solar modules are joined into panels with specific frames and connectors.

Typically, the p-n junction of a solar cell is formed by diffusing an n-type dopant, such as phosphorous, into the surface of a p-type silicon sheet, wafer, or substrate. One example of performing phosphorous diffusion includes coating phosphosilicate glass (PSG) compounds onto the surface of a silicon substrate and carrying out diffusion/annealing inside a furnace. Another example of diffusing a phosphorous dopant into a silicon substrate includes bubbling nitrogen gas through liquid phosphorous oxychloride ($POCl_3$) sources, which are injected into an enclosed quartz tube in a furnace loaded with batch-type quartz boats containing silicon substrates.

When the aforementioned processes are used to form the p-n junction of solar cells in silicon substrates, additional processing steps including etching of PSG is required. In addition, the silicon substrates, on which the diffusion occurs, are usually stacked vertically in the quartz boats for insertion into the furnace. Such handling of the substrates inevitably results in breakage of some of the silicon substrates because the substrates are relatively thin, such as 0.3 mm thick or less.

Once diffusion has occurred to form the p-n junction of the solar cell, the surface of the emitter is typically passivated by depositing dielectric layers onto the surface of the substrate to minimize surface charge carrier recombination.

Although phosphorous diffusion of the phosphorous-doped, n-type silicon material for emitter formation may be created by the furnace type diffusion/annealing processes discussed above, these processes require performing complex gaseous diffusion processes that require many additional pre-cleaning, post-cleaning, etching, and stripping steps. For example, a layer of PSG may remain on the surface of the substrate after formation of the emitter. This PSG layer must be removed by wet chemical etching in diluted hydrofluoric acid solutions.

Additionally, prior art techniques require the usage of separate equipment for the phosphorous diffusion and the deposition of dielectric layers for passivation of the surface of the substrate. The use of such prior art p-n junction formation and surface passivation techniques for solar cell fabrication are expensive and typically result in a defective interface between the dielectric passivation layer and the doped substrate, leading to a high surface recombination velocity for the minority charge carriers.

Moreover, using gaseous diffusion/annealing processes in a furnace, as previously described, typically results in the doping of both sides of the silicon substrate. This requires removing or otherwise isolating the doped front side of the substrate from the doped back side of the substrate in order to make the solar cell functional.

Therefore a need exists for a method for forming an emitter region in a crystalline silicon substrate and passivating the surface thereof to provide a structure for the formation of a solar cell which eliminates many of the pre-cleaning, post-cleaning, etching, and stripping steps present in the prior art, thereby providing a more economical, efficient solar cell fabrication.

SUMMARY OF THE INVENTION

In one embodiment of the present invention, a method for forming a p-n junction on a crystalline silicon substrate comprises placing the crystalline silicon substrate inside a vacuum deposition chamber, delivering a mixture of precursors comprising a silicon-containing compound into the vacuum deposition chamber, depositing an amorphous silicon film on a surface of the crystalline silicon substrate, and heating the crystalline silicon substrate and the amorphous silicon film in an oxygen environment until the amorphous silicon film is completely oxidized.

In another embodiment of the present invention, a method of forming a p-n junction on a p-type crystalline silicon substrate comprises placing the p-type crystalline silicon substrate inside a vacuum deposition chamber, delivering a mixture of precursors comprising a silicon-containing compound, a hydrogen-containing compound, and a phosphorous-containing compound into the vacuum deposition chamber, depositing an n-type amorphous silicon film on the first surface of the silicon substrate, and heating the silicon substrate and n-type amorphous silicon in an oxygen environment until the amorphous silicon film is completely oxidized.

In yet another embodiment of the present invention, a method of forming a p-n junction on a p-type crystalline silicon substrate comprises placing the p-type crystalline silicon substrate inside a vacuum deposition chamber, delivering a mixture of precursors comprising a silicon-containing compound, a hydrogen-containing compound, and a phosphorous-containing compound into the vacuum deposition chamber, depositing an n-type amorphous silicon film on the first surface of the silicon substrate, and directionally heating the silicon substrate and n-type amorphous silicon in an oxygen environment until the amorphous silicon film forms a crystalline grain structure and at least a portion of the crystalline grain structure is oxidized.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

chamber, which may be used in carrying out deposition processes according to certain embodiments of the present invention.

Figure 2:
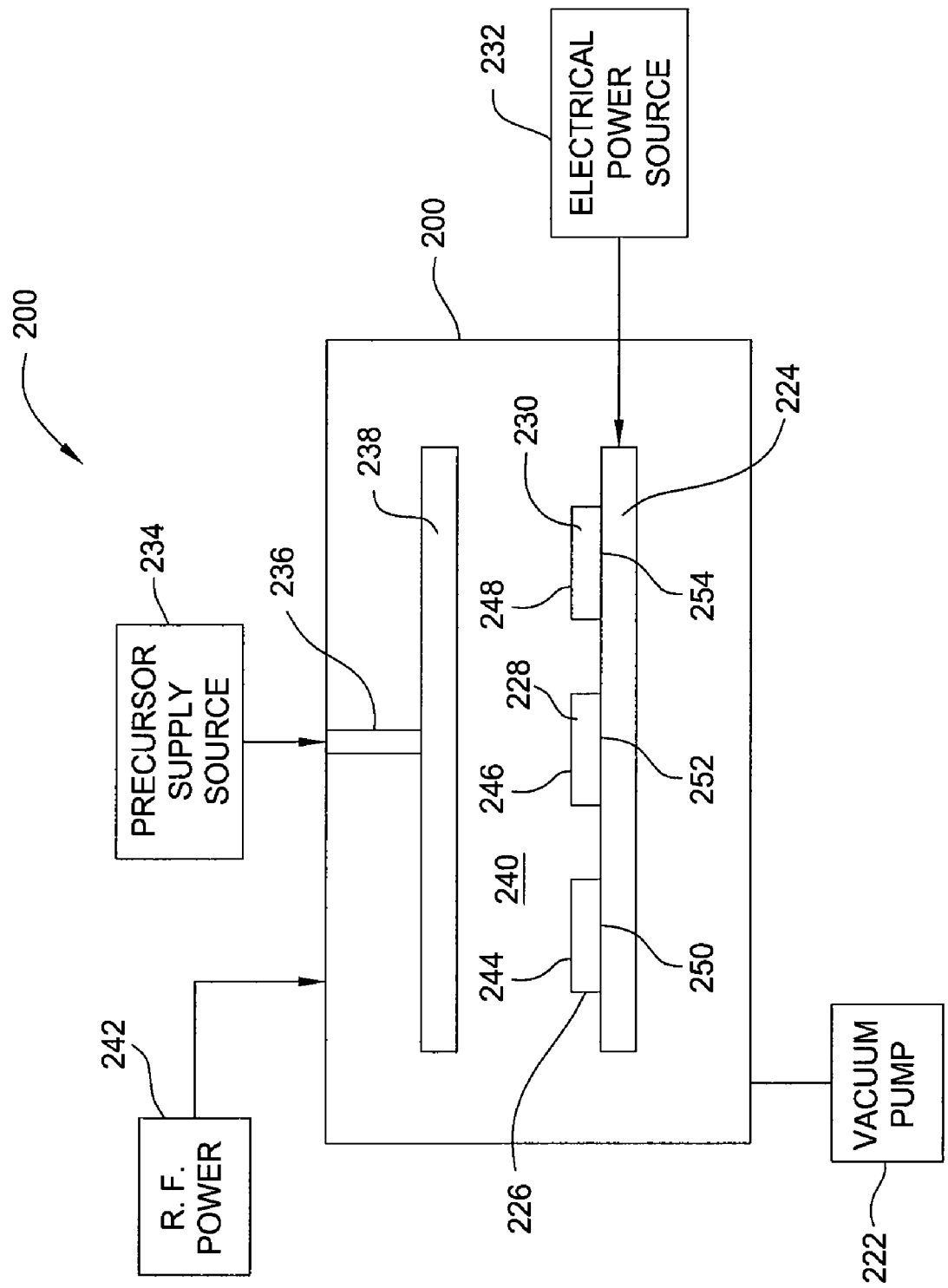
FIG. 2 is a schematic, cross-sectional representation of a plasma-enhanced chemical vapor deposition (PECVD)
Figure 3:
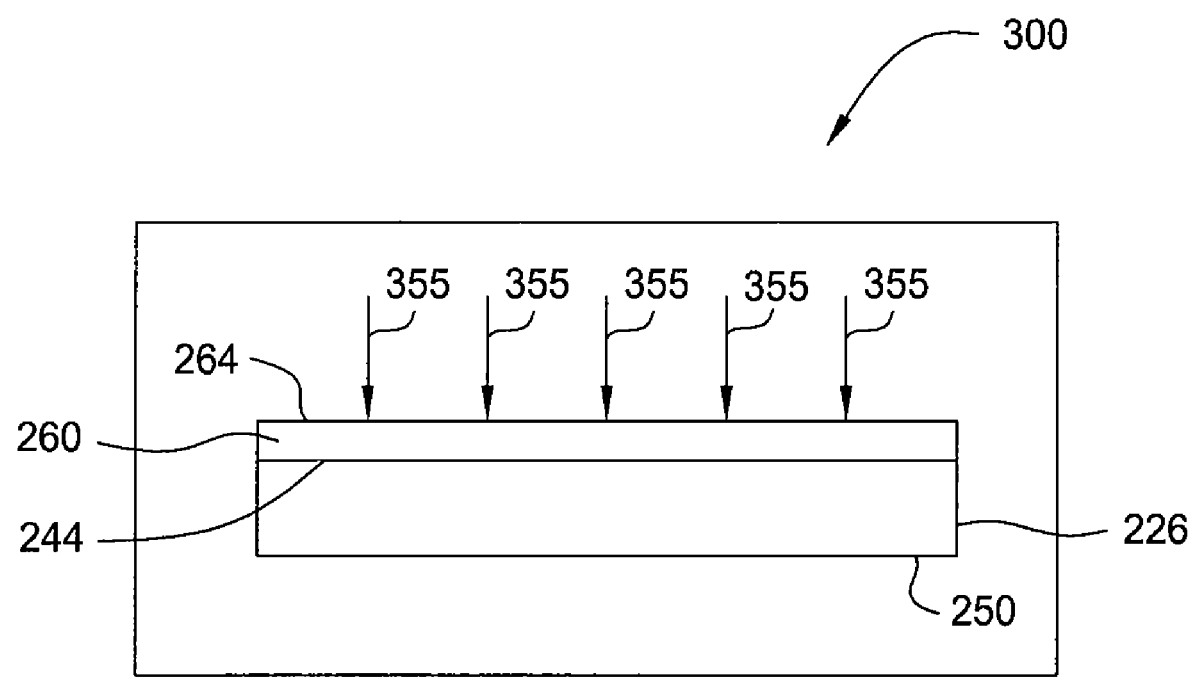

FIG. 3 is a schematic, cross-sectional view of a chamber for heating the lower surfaces of the silicon substrates illustrated in FIG. 2.

DETAILED DESCRIPTION

Embodiments of the present invention provide a method for forming an emitter region in a crystalline silicon substrate and passivating the surface thereof by depositing a doped amorphous silicon layer onto the crystalline silicon substrate and thermally annealing the crystalline silicon substrate while oxidizing the surface thereof. In one embodiment of the present invention, the doped amorphous silicon layer deposited onto the crystalline silicon substrate is completely consumed during silicon oxide formation. In another embodiment, only a portion of the deposited amorphous silicon layer is converted to silicon oxide, while the remaining portion is converted into crystalline silicon having the same grain structure and crystal orientation as the underlying crystalline silicon substrate upon which the amorphous silicon was initially deposited.

Figure 1:
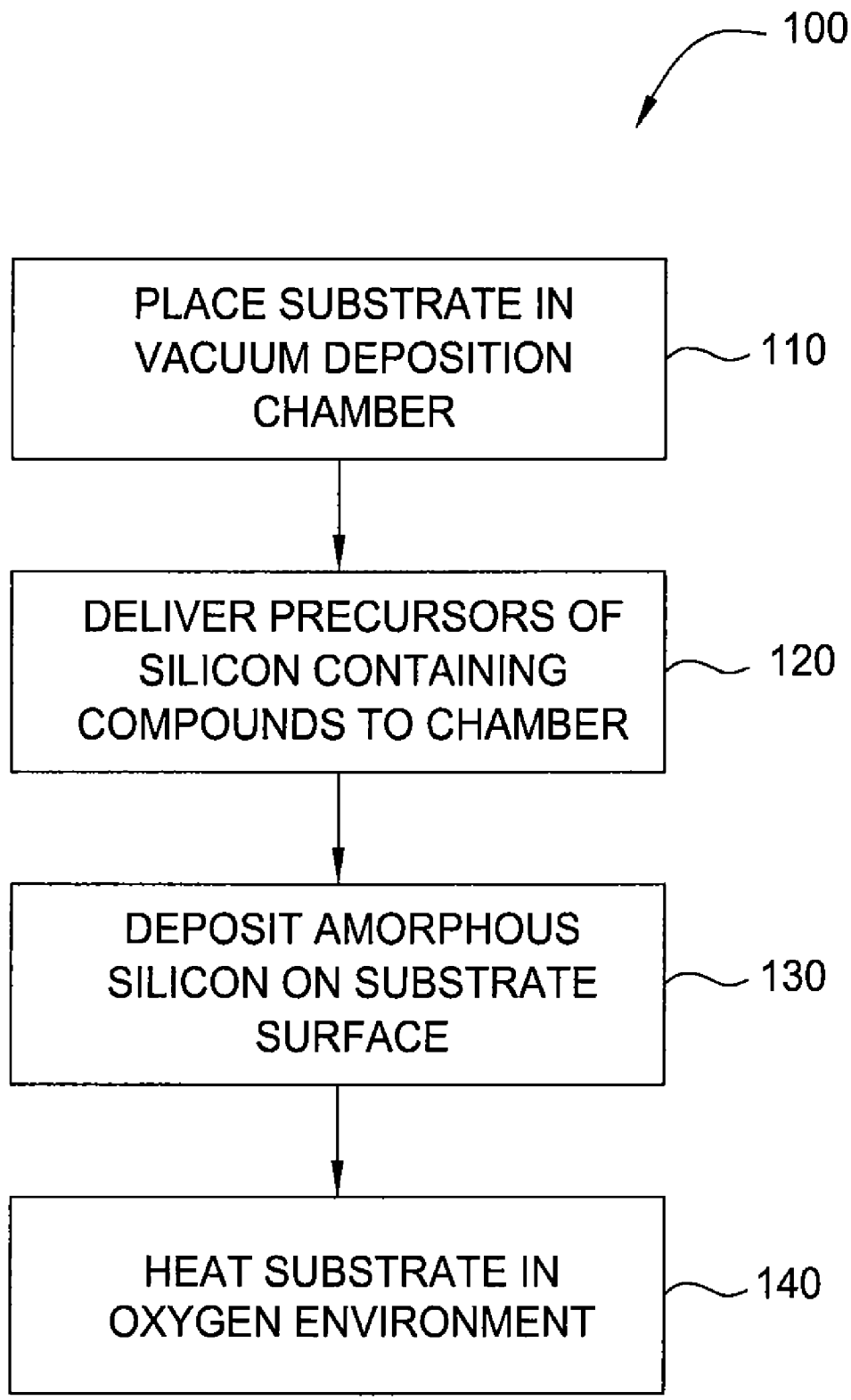
FIG. 1 depicts a process flow diagram illustrating one embodiment of a method of the present invention.

FIG. 1 depicts a process flow diagram illustrating one embodiment of a method 100 of the present invention. At step 110, a crystalline silicon substrate is placed into a vacuum deposition chamber. The substrate may be formed of single crystalline silicon or multi-crystalline silicon depending on the particular application of the product to be produced. The vacuum deposition chamber may be a stand-alone chamber or part of a multi-chamber processing system.

At step 120, a mixture of precursors is delivered into the vacuum deposition chamber. In one embodiment, the mixture of precursors includes silicon-containing compounds. The silicon-containing compounds may include silane ($SiH_4$), disilane ($Si_2H_6$), tetrafluorosilane ($SiF_4$), or other silicon-containing compounds useful for depositing a layer of amorphous silicon directly onto a surface of the crystalline silicon substrate. In one embodiment, the silicon-containing compound is delivered at a flow rate of about 10 sccm or higher depending on the size of the crystalline silicon substrate and vapor deposition chamber. In one embodiment, the silicon-containing compound is delivered at a flow rate between about 50 sccm and about 1500 sccm.

In one embodiment of the present invention, the crystalline silicon substrate is p-type, and an n-type precursor is delivered to the vapor deposition chamber along with the silicon-containing compounds. In one embodiment, the n-type precursor is a phosphorous-containing compound such as phosphine ($PH_3$). In one embodiment, the phosphorous-containing compound is delivered at a concentration of about 0.5% in hydrogen at a flow rate of about 5 sccm or higher. In one embodiment, the phosphorous-containing compound is delivered at a flow rate of between about 50 sccm and about 1500 sccm.

In one embodiment, the mixture of precursors delivered to the deposition chamber includes a hydrogen-containing compound such as hydrogen gas ($H_2$). In one embodiment, the hydrogen-containing compound is delivered at a flow rate of about 100 sccm or higher. In one embodiment, the hydrogen-containing compound is delivered at a flow rate of about 1000 sccm or higher.

In one embodiment, the mixture of precursors delivered to the deposition chamber includes silane, hydrogen gas, and phosphine.

At step 130, a doped amorphous silicon film is deposited on a first surface of the crystalline silicon substrate from the gas mixture in step 120. In one embodiment, the doped amorphous silicon film is deposited at a film thickness from about 10 Å to about 1000 Å. In one embodiment, the doped amorphous silicon film is deposited at a film thickness from about 50 Å to about 100 Å. In one embodiment, the crystalline silicon substrate is p-type, and the amorphous silicon film is n-doped. In one embodiment, a phosphorous-doped amorphous silicon film is deposited on the upper surface of the crystalline silicon substrate from the gas mixture in step 120.

At step 140, the crystalline silicon substrate is heated in an oxygen environment. In one embodiment, heat is applied to the crystalline silicon substrate in a rapid thermal processing (RTP) chamber in an oxygen environment. In one embodiment, heat is applied to the crystalline silicon substrate in a RTP chamber in an environment comprising a mixture of oxygen and hydrogen. In one embodiment, heat is applied to the crystalline silicon substrate in an environment comprising oxygen and hydrogen in a furnace annealing process. In one embodiment, heat is applied to a second surface of the crystalline silicon substrate, which is on the opposite side of the substrate from the side on which the doped amorphous silicon layer was deposited.

Accordingly, heat is applied to the crystalline silicon substrate at a suitable temperature, such as between about 750° C. and about 1200° C., and over a suitable period of time, such as between about 5 seconds and about 30 minutes, to form the desired depth of the p-n junction, the desired dopant profile, and the desired passivating oxide layer on the surface of the substrate. In one embodiment, a temperature of about 950° C. is applied to the substrate for a period of approximately 120 seconds.

The application of heat in the presence of oxygen for a controlled time period causes the dopant to diffuse into the original crystalline substrate resulting in a desired dopant profile with a higher concentration of dopant piling up at the interface with the oxide layer and a lower concentration of dopant at the p-n junction.

Further, the application of heat in an atmosphere comprising oxygen converts the surface of the crystalline silicon substrate into silicon dioxide ($SiO_2$), passivating the surface of the formed emitter region. In one embodiment, a selected portion of the converted silicon is consumed in the oxidation process. In one embodiment, the entire portion of the converted silicon is consumed in the oxidation process. The growth of a 1000 Å film of silicon-oxide consumes about 440 Å of silicon. Therefore, in one embodiment, the amount of silicon consumed in the oxidation process is controlled by controlling the annealing/oxidizing temperature and the annealing/oxidizing time.

In one embodiment, the amorphous silicon is phosphorous-doped (n-type) and the crystalline silicon substrate is p-type. In one embodiment, the depth of the p-n junction is controlled by altering the level of doping of the deposited amorphous silicon layer since the doping atoms diffuse into the p-type substrate during the oxidation process. In one embodiment, the depth of the p-n junction is controlled by controlling the thickness of doped amorphous silicon layer, the annealing temperature, and/or the annealing time.

FIG. 2 is a schematic, cross-sectional representation of a plasma-enhanced chemical vapor deposition (PECVD) chamber 200, which may be used in carrying out deposition processes according to certain embodiments of the present invention. In one embodiment, the chamber 200 includes a plurality of walls enclosing a processing area 240. The processing area 240 may be evacuated by a vacuum pump 222 as known in the art. A support 224 upon which a plurality of crystalline silicon substrates 226, 228, and 230 may be placed is disposed in the processing area. As shown in FIG. 2, the substrates 226, 228, and 230 are positioned horizontally on the support 224. Thus, only the upper surfaces 244, 246, 248 are exposed to the process area 240. The support 224 is connected to an electrical power source 232 to heat the substrates 226, 228, 230 to a temperature required for PECVD within the chamber 200. A precursor supply source 234 is connected to a conduit 236 for conveying the appropriate compounds to a showerhead 238. The showerhead 238 distributes the precursor compounds throughout the processing area 240 of the chamber 200. The precursor compounds may be energized into plasma within the processing area 240 by the application of RF power to the showerhead 238 from a power source 242. Typically, the support 224 is electrically grounded. For a more detailed illustration and explanation of one embodiment of a PECVD useful for carrying out embodiments of the present invention, reference is made to U.S. Pub. No. 2006/0060138 A1, which is incorporated in its entirety herein. As is well known to those skilled in the art, the plasma produces ions within the process area 240 causing an amorphous silicon film to be deposited upon the upper surfaces 244, 246, 248 the substrates 226, 228, 230.

In one embodiment, plasma deposition within the chamber 200 continues for a period of time sufficient to deposit a layer of doped amorphous silicon on the substrate surfaces 244, 246, 248. In one embodiment, the layer of doped amorphous silicon is deposited at a film thickness from about 10 Å to about 1000 Å. In one embodiment, the layer of doped amorphous silicon is deposited at a film thickness from about 50 Å to about 100 Å. In one embodiment, the layer of amorphous silicon is heavily doped with phosphorous. In one embodiment, the layer of amorphous silicon is doped with phosphorous to a concentration of about $1.5 \times 10^{21}$ atoms/cm$^3$.

FIG. 3 is a schematic, cross-sectional view of a chamber 300 for heating the upper surfaces 244, 246, 248 of the silicon substrates 226, 228, 230 illustrated in FIG. 2. In one embodiment, the chamber 300 is a rapid thermal processing (RTP) chamber within which the application of the heat is controlled and applied in an environment comprising oxygen and, optionally, hydrogen. In FIG. 3 only a single substrate 226 is shown for clarity. In one embodiment, the crystalline substrate 226 has a doped amorphous silicon layer 260 deposited thereover.

In one embodiment, the silicon substrate 226 has heat 355 applied to the upper surface 244 thereof in an environment comprising oxygen and, optionally, hydrogen. In one embodiment, the heat 355 is applied to the upper surface 244 of the silicon substrate 226 at a temperature of about 750° C. to about 1200° C. for a time period of about 5 seconds to about 30 minutes. In one embodiment of the present invention, the heat 355 is applied to the upper substrate surface 244 at a temperature of about 950° C. for a period of about 120 seconds.

In one embodiment, the application of heat 355 at a high temperature for a short time period in an oxidizing atmosphere causes the dopant concentration to pile up at the interface of the oxide formed and the deposited silicon layer 260. Additionally, this application of heat 355 causes the dopant to diffuse into the original crystalline substrate 226, establishing a p-n junction at a desired depth in the substrate 226.

In one embodiment, the controlled application of heat 355 in an environment comprising at least oxygen, oxidizes at least the surface 264 of the amorphous silicon layer 260. In one embodiment, the entire amorphous silicon layer 260 is oxidized.

EXAMPLE 1

In one example, a 50 Å thick amorphous silicon film was deposited via plasma enhanced chemical vapor deposition onto a crystalline silicon substrate with a phosphorous doping concentration of $1.5 \times 10^{21}$ atoms/cm$^3$. The resulting structure was annealed via RTP at 950° C. for 120 seconds in an oxygen environment. The resulting structure had a silicon oxide film with a resulting thickness substantially the same as that of the originally deposited amorphous silicon film. The phosphorous in contact with the crystalline substrate diffused into the substrate resulting in a p-n junction depth of 1900 Å. The resulting structure had a dopant profile with a high concentration of dopant collected at the silicon dioxide/silicon interface and decreasing to a lower concentration of dopant at the p-n junction.

EXAMPLE 2

In another example, a 100 Å thick amorphous silicon film was deposited via plasma enhanced chemical vapor deposition onto a crystalline silicon substrate with a phosphorous doping concentration of $1.5 \times 10^{21}$ atoms/cm$^3$. The resulting structure was annealed via RTP at 950° C. for 120 seconds in an oxygen environment. The resulting structure had a silicon oxide film with a resulting thickness substantially the same as that of the originally deposited amorphous silicon film. The phosphorous in contact with the crystalline substrate diffused into the substrate resulting in a p-n junction depth of 2300 Å. The resulting structure had a dopant profile with a high concentration of dopant collected at the silicon dioxide/silicon interface and decreasing to a lower concentration of dopant at the p-n junction.

Although the invention has been described in accordance with certain embodiments and examples, the invention is not meant to be limited thereto. For instance, the PECVD process described herein can be carried out using other chemical vapor deposition (CVD) chambers, adjusting the gas flows, pressure, plasma density, and the temperature so as to obtain high quality amorphous films at practical deposition rates. Additionally, embodiments of the present invention may be carried out via hot wire chemical vapor deposition (HWCVD), low pressure chemical vapor deposition (LPCVD), or physical vapor deposition (PVD). Furthermore, embodiments of the invention include scaling up or scaling down any of the process parameters or variables as described herein according to the number of substrates being utilized, chamber conditions, chamber sizes, and the like.

While the foregoing is directed to embodiments of the present invention, other and further embodiments of the invention may be devised without departing from the basic scope thereof, and the scope thereof is determined by the claims that follow.

The invention claimed is:

1. A method for forming a p-n junction in a crystalline silicon substrate, comprising:

placing the crystalline silicon substrate inside a vacuum deposition chamber;

delivering a mixture of precursors comprising a silicon-containing compound and a dopant into the vacuum deposition chamber;

depositing a doped amorphous silicon film on a surface of the crystalline silicon substrate; and heating the crystalline silicon substrate and the doped amorphous silicon film in an oxygen environment until the p-n junction is formed in the crystalline silicon substrate and the doped amorphous silicon film is completely oxidized.

2. The method of claim 1, wherein the silicon-containing compound comprises a compound selected from the group consisting of silane, disilane, tetrafluorosilane, and combinations thereof.

3. The method of claim 2, wherein the mixture of precursors further comprises hydrogen gas.

4. The method of claim 1, wherein the dopant is phosphine.

5. The method of claim 1, wherein the heating is performed inside a single substrate rapid thermal processing chamber.

6. The method of claim 5, wherein the heating is performed by heating a surface of the substrate opposite the surface having the doped amorphous silicon film.

7. The method of claim 5, wherein the heating occurs at a temperature from about 750° C. to about 1200° C. for about 5 seconds to about 30 minutes.

8. A method of forming a p-n junction in a p-type crystalline silicon substrate, comprising:
   placing the p-type crystalline silicon substrate inside a vacuum deposition chamber;
   delivering a mixture of precursors comprising a silicon-containing compound, a hydrogen-containing compound, and a phosphorous-containing compound into the vacuum deposition chamber;
   depositing an n-type amorphous silicon film on the first surface of the silicon substrate; and
   heating the silicon substrate and n-type amorphous silicon in an oxygen environment until the p-n junction is formed in the p-type crystalline silicon substrate and the amorphous silicon film is completely oxidized.

9. The method of claim 8, wherein the silicon-containing compound comprises a compound selected from the group consisting of silane, disilane, tetrafluorosilane, and combinations thereof.

10. The method of claim 9, wherein the phosphorous-containing compound is phosphine.

11. The method of claim 10, wherein the mixture of precursors comprises silane, hydrogen gas, and phosphine.

12. The method of claim 11, wherein the heating is performed inside a single substrate rapid thermal processing chamber.

13. The method of claim 11, wherein the heating is performed by heating a surface of the crystalline silicon substrate opposite the side having the amorphous silicon film formed thereon.

* * * * *